(12) United States Patent
Kwak

(10) Patent No.: US 9,508,417 B2
(45) Date of Patent: Nov. 29, 2016

(54) METHODS AND APPARATUSES FOR CONTROLLING TIMING PATHS AND LATENCY BASED ON A LOOP DELAY

(71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/185,194

(22) Filed: Feb. 20, 2014

(65) Prior Publication Data

US 2015/0235691 A1    Aug. 20, 2015

(51) Int. Cl.
*G11C 7/22* (2006.01)
*G11C 11/4076* (2006.01)

(52) U.S. Cl.
CPC ............ *G11C 11/4076* (2013.01); *G11C 7/222* (2013.01); *G11C 2207/2272* (2013.01)

(58) Field of Classification Search
CPC .................................. G11C 7/222; G11C 7/22
USPC .............................................. 365/194, 233.5
See application file for complete search history.

(56) References Cited

U.S. PATENT DOCUMENTS

| | | | |
|---|---|---|---|
| 5,004,933 A | 4/1991 | Widener | |
| 6,111,810 A | 8/2000 | Fujita | |
| 6,219,384 B1 | 4/2001 | Kliza et al. | |
| 6,260,128 B1 | 7/2001 | Ohshima et al. | |
| 6,275,077 B1 | 8/2001 | Tobin et al. | |
| 6,327,318 B1 | 12/2001 | Bhullar et al. | |
| 6,424,592 B1 | 7/2002 | Maruyama | |
| 6,438,055 B1 | 8/2002 | Taguchi et al. | |
| 6,459,313 B1 | 10/2002 | Godbee et al. | |
| 6,489,823 B2 | 12/2002 | Iwamoto | |
| 6,510,095 B1 | 1/2003 | Matsuzaki et al. | |

(Continued)

FOREIGN PATENT DOCUMENTS

| | | |
|---|---|---|
| CN | 101752009 A | 6/2010 |
| JP | 2013-222997 A | 10/2013 |
| TW | 201303735 | 1/2013 |

OTHER PUBLICATIONS

"Interfacing DDR SDRAM with Stratix II Devices", Version 3.2, Altera Corp, Sep. 2008.

(Continued)

*Primary Examiner* — Michael Tran
(74) *Attorney, Agent, or Firm* — Dorsey & Whitney LLP

(57) ABSTRACT

Apparatuses and methods for controlling timing circuit locking and/or latency during a change in clock frequency (e.g. gear down mode) are described herein. An example apparatus may include a timing circuit. The timing circuit may be configured to provide a clock signal to the forward path, adjust a rate of the clock signal responsive to receipt of a command to adjust the rate of the clock signal, select a feedback clock signal responsive to a loop delay of the timing circuit, and provide a control signal to an adjustable delay circuit of the forward path circuit. Another example apparatus may include a forward path configured to delay a signal based at least in part on a loop delay and a latency value, and a latency control circuit configured to provide an adjusted latency value as the latency value responsive to receipt of a command, wherein the forward path is configured to operate at least in part at an adjusted clock rate responsive to receipt of the command.

22 Claims, 4 Drawing Sheets

(56) References Cited

U.S. PATENT DOCUMENTS

| | | |
|---|---|---|
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,580,321 B2 | 8/2009 | Fujisawa et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,788,896 B2 | 7/2014 | Tekumalla |
| 9,001,955 B2* | 4/2015 | Lamanna et al. ............ 375/376 |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 2001/0015924 A1 | 8/2001 | Arimoto et al. |
| 2002/0057624 A1 | 5/2002 | Manning |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0327926 A1* | 12/2010 | Takahashi ............ G11C 7/222 327/158 |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0102039 A1* | 5/2011 | Shin ........................... 327/175 |
| 2011/0228625 A1 | 9/2011 | Bringivijayaraghavan |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1* | 8/2012 | Kim .............................. 327/158 |
| 2012/0254873 A1 | 10/2012 | Bringivijayaraghavan |
| 2012/0269015 A1 | 10/2012 | Bringivijayaraghavan |
| 2012/0274376 A1* | 11/2012 | Gomm et al. ............... 327/158 |
| 2013/0002320 A1 | 1/2013 | Lin et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |

(56) References Cited

U.S. PATENT DOCUMENTS

| | | |
|---|---|---|
| 2014/0055184 A1 | 2/2014 | Vankayala |
| 2014/0119141 A1 | 5/2014 | Tamlyn et al. |
| 2014/0176213 A1* | 6/2014 | Rylov .......................... 327/237 |
| 2014/0177359 A1 | 6/2014 | Kumar et al. |
| 2014/0258764 A1 | 9/2014 | Kwak |
| 2014/0293719 A1 | 10/2014 | Jung |
| 2015/0156009 A1 | 6/2015 | Bogdan |
| 2015/0170725 A1 | 6/2015 | Kwak |
| 2015/0340072 A1 | 11/2015 | Mazumder |
| 2016/0056807 A1 | 2/2016 | Neidengard et al. |

OTHER PUBLICATIONS

Lee, "How to Implement DDR SGRAM in Graphic System", Samsung Electric, 4Q1998.

U.S. Appl. No. 14/698,550, entitled "Methods and Apparatuses Including Command Latency Control Circuit", filed Apr. 28, 2015.

U.S. Appl. No. 15/139,102, entitled "Methods and Apparatuses Including Command Delay Adjustment Circuit", filed Apr. 26, 2016.

U.S. Appl. No. 15/139,120, entitled "Appartuses and Methods for Adjusting a Delay of a Command Signal Path", filed Apr. 26, 2016.

U.S. Appl. No. 15/243,651, entitled "Apparatuses and Methods for Adjusting Delay of Command Signal Path", filed Aug. 22, 2016.

\* cited by examiner

METHODS AND APPARATUSES FOR CONTROLLING TIMING PATHS AND LATENCY BASED ON A LOOP DELAY

BACKGROUND

Examples described herein relate generally to signal paths in memory. Examples of methods and apparatuses are described for controlling the locking of a delay locked loop in a timing path when a memory clock changes frequency (e.g. when a memory is placed in gear down mode).

Memory, such as dynamic random access memory (DRAM), is used in a multitude of electronics systems (e.g., portable computers, desktop computers, server systems, mobile devices, etc.) and has gone through several advancements over the years. For example, double data rate DRAM (DDRAM) was a first progression from the initial DRAM and operates at double the rate. Since then, DDRAM has also gone through a series of development milestones with each milestone improving the performance. This progression of development resulted in sequentially numbered DDRAM, e.g. DDR2, DDR3, and DDR4 development iterations. The DDR4 iteration has introduced new operating modes due to the ever increasing clock speeds of current computing systems employing DDR memories.

One of the new modes being discussed is a gear down mode. The gear down mode may be used when the DDR4 memory is included in a system that is generally running at a very high clock frequency. Gear down mode may at least involve the DDR4 memory reducing the internal clock rate of operation, e.g., divide the clock by two, which may allow for reduced power consumption and relaxed internal timing constraints. The command to gear down may be received at any time and the DDR4's timing circuit may experience some issues when gearing down in various situations. For example, a delay locked loop (DDL) may have trouble staying locked, e.g., keeping the output clock signal remaining in phase with the input clock signal, when converting to a reduced internal clock rate. Additionally, a latency of a forward path may need to be adjusted based on the new internal clock, rate of the DDR4 memory while in the gear down mode.

BRIEF DESCRIPTION OF THE. DRAWINGS

DETAILED DESCRIPTION

Figure 1:
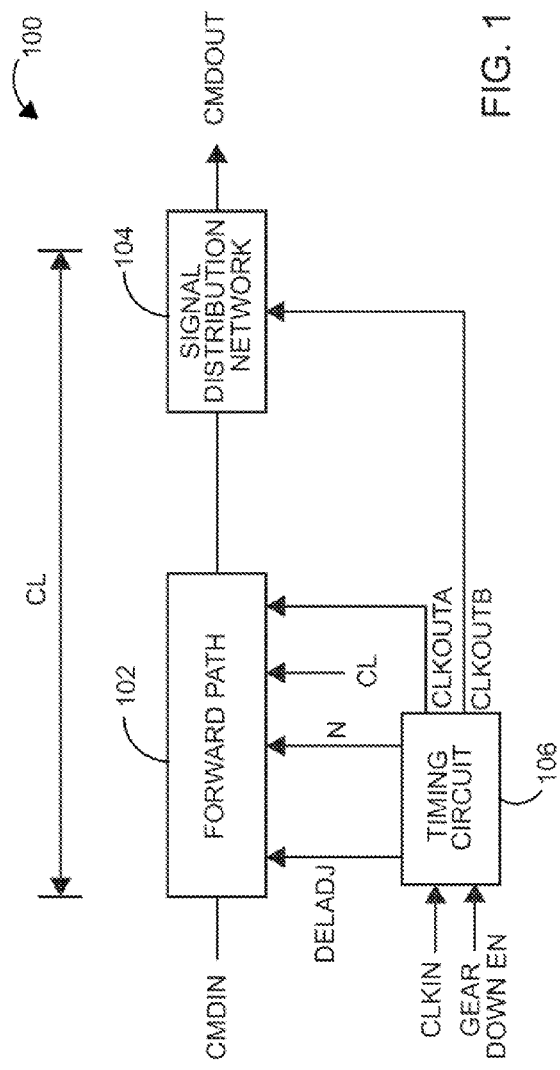
FIG. 1 is a schematic illustration of an apparatus arranged in accordance with embodiments discussed herein.

Apparatuses and methods for controlling locking loops, latency, and/or combinations thereof, are described herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As noted above, memory devices may receive commands to adjust (e.g. reduce) an internal clock signal. For example, a memory (e.g. a DDR4 memory) may receive a command to enter a gear down mode, which may indicate to operate at a reduced clock rate (e.g. half an initial clock frequency). When the clock frequency changes, problems may be encountered in maintaining a locking loop (e.g. a DLL) in a locked state. Moreover, it may be desirable for the memory (e.g. DDR4 memory) to maintain the latency of the memory according to a received CAS latency value.

Generally, a locked locking loop as described herein may refer to a locking loop when a reference clock signal and a feedback clock signal of the locking loop (e.g. DLL) meet a predetermined criteria (e.g., are in phase). Examples described herein generally utilize a DLL as an example locking loop, however it is to be understood that other timing circuits may be used additionally or instead—including, but not limited to, PLLs and DCCs. Latency (e.g. CAS latency) generally refers to a number of clock cycles that occur between the memory receiving a command, e.g., a read command, and when the data should appear on the output pads of the memory. The latency may be based on the system clock, which may be double the frequency of the memory's internal clock frequency when in the gear down mode. This difference in internal clock frequency and the external clock frequency may need to be accounted for in a forward path of the memory during gear down mode to ensure the latency remains constant.

Behavior of a DLL following a change in the internal clock signal (e.g. a transition to gear down mode) may depend on the number of clock cycles used to lock the external and internal signal in a previous locking operation (e.g. the number of clock cycles the incoming clock signal takes to traverse the loop). For example, when locked, an input clock signal may take 6 clock cycles to traverse a DLL. Whether that number of clock cycles is even or odd may determine adjustments made to the DLL so to remain locked when the internal clock changes frequency, such as when gear down mode is entered.

Resetting the DLL when the internal clock changes frequency, such as during gear down mode, may be possible, but the reset may cause performance degradation due to the large number of clock cycles the DLL may need to re-acquire the locked state. If the DLL had a loop delay (e.g. a time for an input clock to traverse the loop) of an even number of clock cycles, then transitioning to the gear down mode by halving the internal clock frequency may not affect the DLL, because the loop delay may still be expressed as an integer number of clock cycles, albeit half as many as previously. Thus, no adjustments may be initiated. However, it the DLL loop delay had been an odd number of clock cycles, then the DLL may no longer be locked after halving the clock frequency, because the loop delay may no longer be expressed as an integer number of clock cycles. Instead, the reference clock signal and the feedback clock signal may be out of phase, e.g. 180 degrees out of phase. The phase mismatch may arise from the fact that only an integer number of internal clock cycles may be used in the loop delay. Accordingly, if the loop delay had been, for example, 5, prior to entry into gear down mode, then when gear down mode is entered, the loop delay should be equal to 2.5 clock cycles to attain the same match. However, because only an integer number of clock cycles may be used for the loop delay, 3 clock cycles of delay may be used, resulting in an extra 0.5 cycles of delay, or 180 degrees out of phase in some examples. In this scenario, the feedback clock signal may be inverted when in gear down mode in order to maintain the DLL in the locked state, as described herein.

With regards to latency, the CAS latency value received by the memory may be based on the external clock rate, which, for example, may be twice the clock rate of the internal memory clock when in gear down mode. In this situation, the CAS latency may need to be expressed in the gear down clock rate. Any additional delay added by the memory to the command path, for example, may also need to be converted to the gear down clock rate. Without converting the delay amounts to the gear down clock rate, the memory module may not strobe the data pads at the expected time.

Accordingly, embodiments of memory described herein may include DLL locking control, CAS latency control, or combinations thereof which may alter operation of the memory when the memory changes a frequency of an internal clock (e.g. when the memory operates in gear down mode). Accordingly, in some examples, memories described herein may continue to perform as expected without performance degradation while reducing power consumption and relaxing timing constraints. The locking control and/or CAS latency control may be implemented in embodiments where the memory receives a locking circuitry reset command concomitantly with or after transitioning to gear down mode.

FIG. 1 is a schematic illustration of an apparatus 100 arranged in accordance with various embodiments discussed herein. The apparatus 100 includes a forward path 102, a signal distribution network 104 and a timing circuit 106. The apparatus 100 may receive CMDIN as an input, which may for example be a write command, and may be provided to the forward path 102. The CMDIN may also include address information. The forward path 102 may delay the command in accordance with a latency value (CL) received as an input, e.g., a CAS Latency, and may add additional delay so that the CMDOUT is provided to output pads at an expected time in relation to the latency.

A CLKIN signal is received by the timing circuit 106 of the apparatus 100. The CLKIN signal may be operating at an external system clock rate tCK. The timing circuit may provide timing control for the forward path 102 and the signal distribution network 104 (e.g., CLKOUTA and CLOCKOUTB) and may provide a delay adjustment control signal DELADJ to the forward path 102. The timing control may be used to ensure that the apparatus 100 strobes the output pads as expected. The timing circuit may adjust the clock rate of the CLKOUTA and CLKOUTB signals responsive to receiving a gear down command on a gear down En input.

A signal received at the gear down En input may command the apparatus 100 to adjust a rate of the internal clock signal (e.g. transition to gear down mode). The gear down command, which may come from an external component to the memory or from another area of the memory, may cause the timing circuit 106 to adjust the clock rate of both CLKOUTA and CLKOUTB. The clock rates of the two signals may be the same and may be less than the clock rate of the CLKIN signal. For example, CLKOUTA and CLKOUTB may be half the clock rate as that of CLKIN and may be designated as 2tCK. Additionally, the gear down En signal may cause the forward path 102 to adjust the latency value CL amount in accordance with the reduced clock rate of CLKOUTA.

The timing circuit 106 may consult a loop counter value N to determine how to respond to the gear down En signal. The loop counter value N may indicate the loop delay of the DLL. If N is an odd number, the timing circuit 106 may respond to the gear down En signal by inverting a feedback signal used to ensure the output clock signals are in phase with the input clock signal. If N is even, however, no adjustment to the feedback signal may be necessary.

The loop counter value N may be determined by the timing circuit each time the timing circuit is reset and may be indicative of a number of clock cycles it took for a DLL of the timing circuit to lock (e.g. a loop delay of the DLL) the last time the timing circuit was reset. The value of N may also affect an amount of delay added to the signal path by the forward path 102. The forward path 102 may adjust N and CL after transitioning to gear down mode, which may determine an amount of delay to add to any signals propagating through the forward path 102 while in the gear down mode. The signal distribution network may also add some delay to the forward path in certain scenarios (e.g., when N is odd) to be further discussed below.

Figure 2:
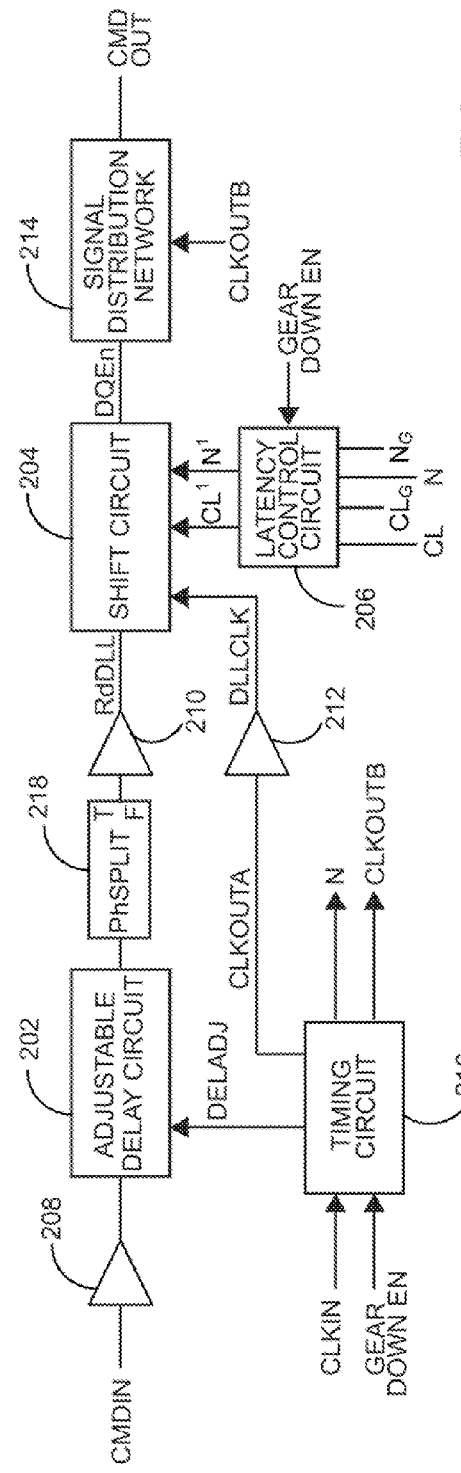
FIG. 2 is a schematic illustration of an apparatus arranged in accordance with embodiments discussed herein.

FIG. 2 is a schematic illustration of an apparatus 200 in accordance with embodiments discussed herein. The apparatus 200 may implement a DLL lock control and latency control during gear down mode of a memory. The apparatus 200 may receive a CMDIN and may provide the CMDOUT delayed in accordance with a CAS latency value CL. A command path of the apparatus 200 may include an adjustable delay circuit 202, a phase splitter 218, a shift circuit 204, two buffers 208, 210, and a signal distribution network 214. The apparatus 200 may further include a timing circuit 216 coupled to the shift circuit 204 via a buffer 212 and also coupled to the adjustable delay circuit 202. A latency control circuit 206 may further be included and may be coupled to the shift circuit 204.

A buffer 208 may receive the CMDIN, which may be provided to an input of the adjustable delay circuit 202. The adjustable delay circuit 202 may delay the CMDIN in accordance with a delay adjust signal DELADJ, provided by the timing circuit 216. An output of the adjustable delay circuit 202 may be provided to a phase splitter 218. An in-phase output of the phase splitter 218 may be provided via the buffer 210 to the shift circuit 204. The output of the buffer 210 may be the labeled RdDLL, which may be a delayed version of CMDIN. The phase splitter 218 may be included in the forward path of the command signal so that an overall delay of the RdDLL is substantially similar to a timing path of the billing circuit 216, to be discussed below.

The timing circuit 216 may receive input clock signal CLKIN, which may be based on an external system clock and may be operating at a clock rate tCK. Further, the timing circuit 216 may receive a gear down En command signifying that the timing circuit 216 is to transition to the gear down mode. When the gear down En signal is asserted, e.g., transitions to a "1," the timing circuit 216 may transition to the gear down mode.

The timing circuit 216 may provide various outputs for various parts of the command path. For example, a delay adjust DELADJ signal may be provided to the adjustable delay circuit 202, which may adjust an amount of delay the adjustable delay circuit 202 adds to a signal propagating through. Further, the timing circuit may provide a clock signal CLKOUTA to the shift circuit 204 and a clock signal CLKOUTB to the signal distribution network 214. The clock signals CLKOUTA and CLKOUTB may be used by the shift circuit 204 and the signal distribution network 214, respectively, to control a timing and/or delay of signal propagation to ensure the CMDOUT signal is strobed at a correct clock cycle. The timing circuit 216 may further provide a loop counter value N to the latency control circuit 206. The loop counter value N may be a value indicative of how many clock cycles, based on the external clock rate tCK, it took for a DLL of the timing circuit 216 to lock. The value N may be stored in a register (not shown) of either the timing circuit 216 or of the apparatus 200.

The latency control circuit 206 may receive a CAS latency value CL and an adjusted CAS latency $CL_G$ and the loop counter value N and an adjusted loop counter $N_G$ as inputs along with a gear down enable input. The latency control circuit 206, based on the gear down En command, may provide the shift circuit 204 with either CL or $CL_G$ and N or $N_G$. The shill circuit 204 may then adjust an amount of delay based on the latency and loop counter values received from the latency control circuit 206.

Upon receiving gear down command, the apparatus 200 may reduce the internal clock rate. For example, prior to receiving the gear down command, the apparatus 200 may have been operating at the external system clock rate tCK and after transitioning to the gear down mode, the apparatus 200 may operate at half the external system clock rate, designated by 2tCK. As noted above, the timing circuit's ability to remain in a locked state may depend on whether the loop counter value N is even or odd. If N is even, then the timing circuit 216 may remain in the locked condition upon transitioning to the gear down mode. On the other hand, if N is odd, the timing circuit 216 may not remain locked upon the transition and a feedback signal may now be out of phase with a reference signal. To remain in the locked condition, the timing circuit 216 may invert the output signal e.g., CLKOUTR, which may also result in a feedback signal of the timing circuit 216 being inverted.

Also upon transitioning to the gear down mode, the latency control circuit 206 may switch from prop the shift circuit 204 unadjusted CL and N values to adjusted $CL_G$ and $N_G$ values. This change to the adjusted CL and N may be made since the shift circuit 204 may be operating based on the CLKOUTA timing signal, which may now be operating at a reduced rate, 2tCK for example. Changing the delay added to a signal propagating through the shift circuit 204 by adjusting CL and N may be done to further ensure the command path is operating with regards to a correct latency.

Further, the signal distribution network 214, operating on the adjusted CLKOUTB signal, may also have to adjust an amount of delay to signals propagating through to the DQ pads, e.g., CMDOUT. This adjustment, however, may depend on whether N is even or odd.

The various sections of the apparatus 200 may be characterized by an amount of associated latency. This associated latency, which may also be discussed in terms of delay, may be inherent to each component. For example, the buffer 208 may be characterized by having a latency of tIB, which may be inherent to the buffer 208. Hence, for the command path portion of the apparatus 200, a total latency should add up to CL*tCK and may be affected by the loop counter value N (both its value and whether it is even or odd). For example, as shown in FIG. 2, when N is either odd or even, the combined latency associated with the adjustable delay circuit 202, the phase splitter 218 and the buffer 210 is N*tCK-(DLL delay model). The DLL delay model may be tIB plus the delay of the signal distribution network, e.g., tTREE. The delay of the shift circuit 204 may be (CL/2-N/2)*2tCK when N is even and when N is odd, the delay may be (CL/2-(N/2+0.5))*tCK. Lastly, the delay of the signal distribution network 214 may be tTREE when N is even and 1*tCK+tTREE when N is odd.

By adjusting CL and N, the apparatus 200 may be ensuring the internal timing between receiving a command and strobing the DQ pads in response occurs as when external components that supplied those commands expects them to occur. Since the internal clock of the apparatus 200 may be operating at twice the period as the external clock when in the gear down mode, the apparatus 200 may adjust CL and N to ensure commands are executed in relation to the adjusted external clock frequency.

Figure 3:
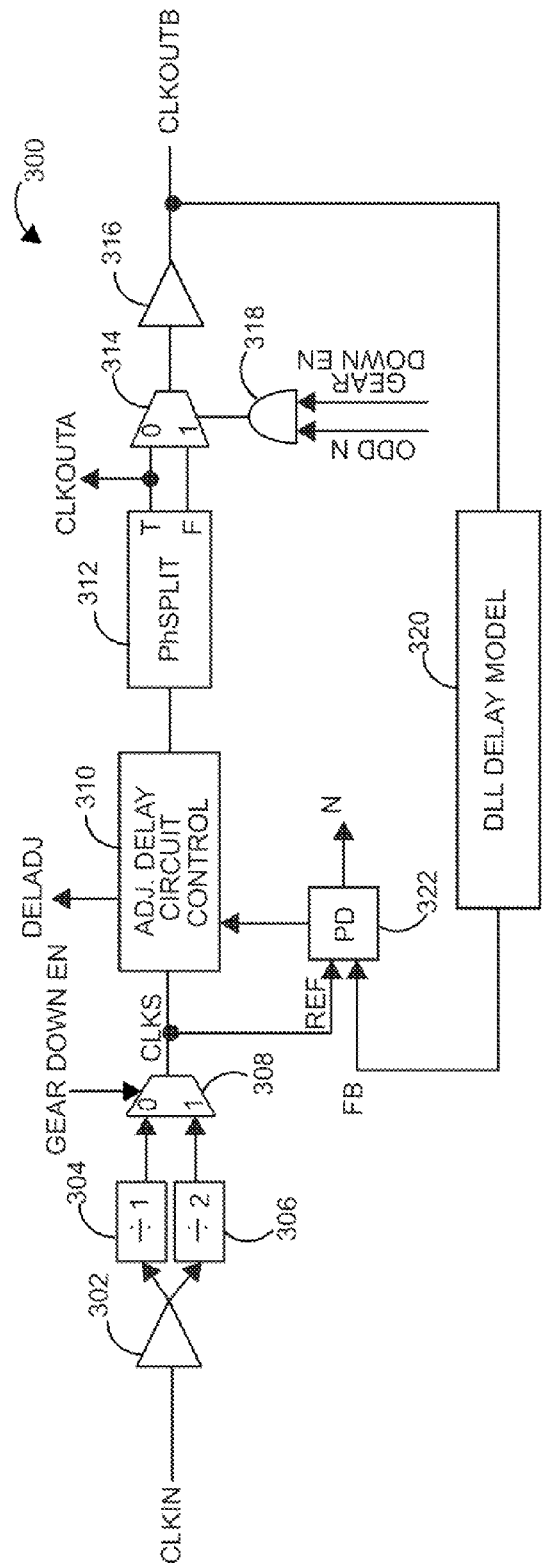
FIG. 3 is an example block diagram of a delay circuit arranged in accordance with embodiments discussed herein.

FIG. 3 is an example block diagram of a delay circuit 300 arranged in accordance with embodiments discussed herein. The delay circuit 300 may be utilized in a timing circuit, such as the timing circuit 106 or 216, to provide clock signals in phase with an input clock signal among other control signals. The delay circuit 300 may receive the CLKIN signal through a buffer 302, which is then split between two divider circuits, 304 and 306. The divider 304 may divide CLKIN by one resulting in no change to the signal's frequency. The divider 306 may divide CLKIN by two resulting in a signal with clock rate divided by two. Thus, if CLKIN is at a rate of tCK, then the output of the divider 306 would be a clock signal of a rate of 2tCK. The outputs of the two divider circuits 304, 306 are provided to a multiplexer (MUX) 308 that uses the gear down En signal to select between the two inputs. For example, when the gear down En signal is a "0" then the MUX 308 may select the output of divider 304, the tCK clock signal. Conversely, when the gear down En signal is a "1" then the MUX may select the output of divider 306, e.g., the 2tCK clock signal. In some examples, the MUX 308 may make opposite selections.

The output of the MUX 308 may then be provided to an adjustable delay control circuit 310 and a phase detector 322. The adjustable delay control circuit 310 may provide the DELADJ control signal to, for example, the adjustable delay circuit 202 of FIG. 2. The adjustable delay control circuit 310 may base the DELADJ signal at least in part on a control signal from the phase detector 322. The phase detector 322 may provide the control signal to the adjustable delay control circuit 310 based on the clock reference signal CLKS and a feedback clock signal FB. The feedback signal ED may come from an output of the delay circuit 300 after passing through a DLL delay model 320. The phase detector 322 may measure a phase difference between the CLKS (or REF) and the FB to generate a control signal to align the phases of the input and output clock signals, e.g., CLKIN and DQ PAD (shown in FIG. 5).

Additionally, the phase detector 322 may generate the loop counter value N upon a reset or start-up of the delay circuit 300. When the delay circuit 300 is reset, for example, the input and the output clock signals may no longer be in phase and the phase detector 322 may take a number of clock signals to bring the delay circuit 300 into control, e.g., into a locked state. The reset may occur while the delay circuit 300 is or is not in the gear down mode. If the delay circuit 300 is not in the gear down mode when a reset occurs, then the loop counter value N may be based on the external system clock tCK. On the other hand, if the reset occurs while in the gear down mode, then the loop counter value N may be based on the reduced clock rate 2tCK. The phase detector 322 may store the N value in a register (not shown).

The output of the adjustable delay control circuit 310 may be provided to a phase splitter 312. The phase splitter 312 may provide two outputs one output, designated with a T, may be in-phase with the input and the other output, designated with an F, may be 180 degrees out of phase with the input, e.g., the input inverted. The two outputs of the phase splitter 312 may be selected by a MUX 314 based on two control signals. The two control signals may be the gear down En signal and an ODD_N signal. The two signals may be combined by the AND gate 318 to generate the MUX 314 select signal. Additionally, the ODD_N signal may indicate that the loop counter value N is an odd integer and may be generated by control logic (not shown). The control logic may be a part of the timing circuit 106 or the apparatus 100 for example. When an odd N is detected upon transition to the gear down mode, the MUX 314 may select the out of phase clock signal so that the delay circuit 300 remains in the locked condition. Conversely, when N is even, the MUX 314 selects the in-phase output of the phase splitter 312 as the CLKOUTB and feedback signal of the delay circuit 300. By determining whether the loop counter value N is even or odd, the delay circuit 300 may remain in the locked condition by selecting the respective output of the phase splitter 312 as the feedback clock signals.

The output of the MUX 314 may be received by a buffer 316, which provides the output clock CLKOUTB and the FB signal to the DLL delay model 320. It should also be noted that the output clock signal CLKOUTA may be taken from the in phase output of the phase splitter 312. The CLKOUTA signal may be provided, to a shift circuit, such as shift circuit 204 for example.

When a gear down mode command is received, the gear down En signal may be asserted high, for example, which may cause the delay circuit 300 to reduce the clock rate from tCK to 2tCK, for example. Further, depending on whether N is odd or even, the phase of the feedback clock may be adjusted so that the delay circuit 300 maintains the locked condition. For example, if N is odd and the delay circuit 300 is commanded to gear down, then the MUX 308 selects the reduced clock rate from divider 30 and the out of phase output of the phase splitter 312 is selected by the MUX 314. By selecting the inverted clock signal for the output signal and the FB signal, the delay circuit 300 may remain in the locked condition.

Figure 4:
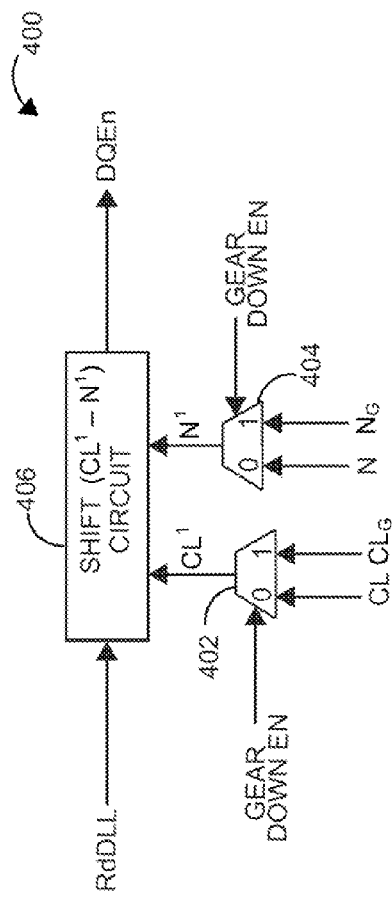
FIG. 4 is an example block diagram of a latency control circuit arranged in accordance with embodiments discussed herein.

FIG. 4 is an example block diagram of a latency control circuit 400 arranged in accordance with embodiments discussed herein. The latency control circuit 400 may control the latency of a shift circuit 406 when a memory transitions to and is in a gear down mode. The latency control circuit may be used by the apparatus 200 and may be an example of the latency control circuit 206. An example of a latency control circuit may be illustrated by the two MLA 402, 404. The MUX 402 and 404 may be implemented as the latency control circuit 206 of FIG. 2, for example. The latency control circuit 400 may receive the RdDLL, as shown in FIG. 2, and add extra delay to RdDLL in response to the latency control values CL' and N' resulting in a further delayed command signal DQEn provided as an output.

The MUX 402 may receive two inputs from other control logic (not shown), the two inputs being the CAS latency value CL and an adjusted CAS latency value $CL_G$. The control logic that provides the inputs may be included in a timing circuit, such as the timing circuit 216, or by a memory utilizing, for example, the apparatus 200. The adjusted latency control value $CL_G$ may be CL divided by two, for example, and may also be determined by the control logic CL may be divided by two since the adjusted clock rate is the external system clock divided by two. The adjustment of the CL may need to be commensurate with the adjustment of the internal clock signal when in gear down mode. Other adjustment values are within the scope of this disclosure. The output of the MUX 402 may be controlled by the gear down En control input. When not in the gear down mode, the MLA 402 may provide to the shift circuit 406 and $CL_G$ when in the gear down mode.

Similarly, the MIA 404 may receive the loop counter value N and the adjusted loop counter value $N_G$ along with the control signal gear down En as inputs. When in the gear down mode, the MUX 404 may provide $N_G$ to the shift circuit 406, otherwise the MLA 404 provides N. Again, N and $N_G$ may be provided by control logic (not shown) and the value of $N_G$ may depend on whether N is odd or even. Again, N may be divided by two in either case and two is used because, as noted above with regards to $CL_G$, the clock rate has been divided by two. If N is even, the $N_G$ is N divided by two. On the other hand, if N is odd, $N_G$ is N divided by 2 but is also rounded up to the next integer, e.g., $N_G=N/2+0.5$. By rounding up $N_G$ when N is odd, there is a loss of delay since the shift circuit 406 subtracts N' from CL' to arrive at the amount of delay to add to a forward path. To make up for this loss of delay an extra clock cycle amount of delay is added to a signal passing through the command path later on in the distribution circuit.

Figure 5:
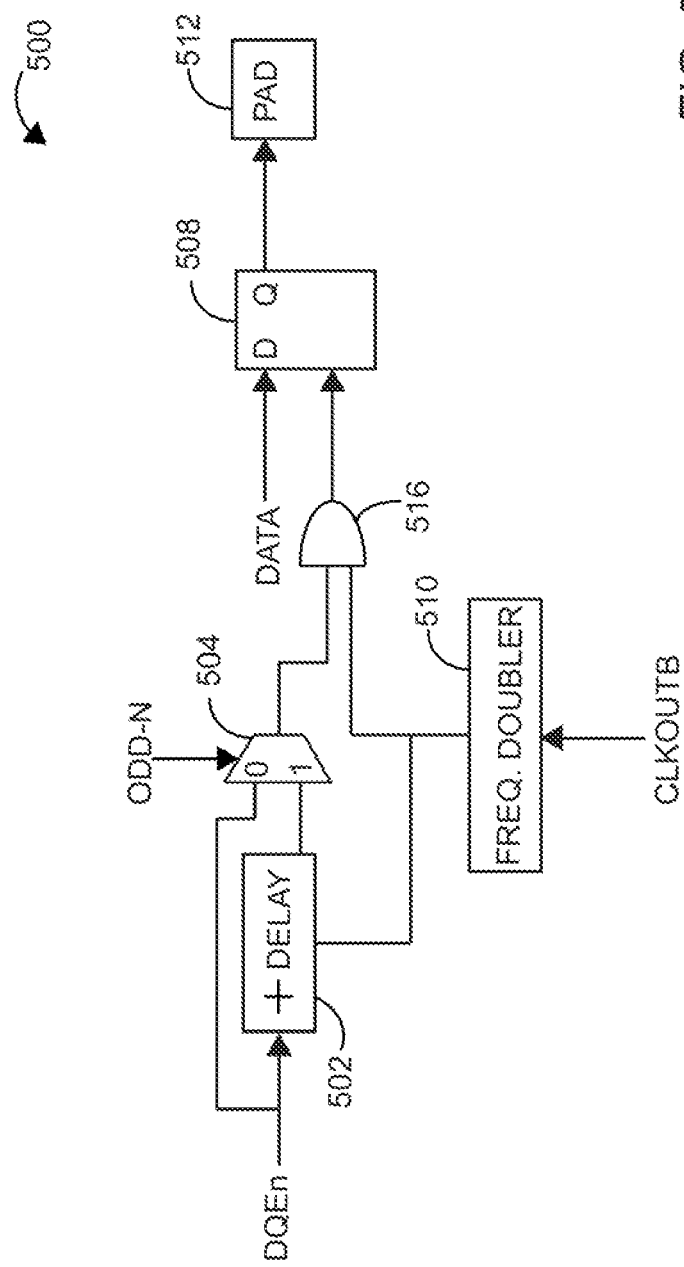
FIG. 5 is an example block diagram of a delay adjust circuit of a signal distribution network arranged in accordance with embodiments discussed herein.

FIG. 5 is an example block diagram of a delay adjust circuit 500 of a signal distribution network arranged in accordance with embodiments discussed herein. The delay adjust circuit 500 may be a part of a distribution network (distribution tree) of a memory and may, for example, be implemented in the signal distribution network 214 of FIG. 2. The delay adjust circuit 500 may be close to the DQ output pads of the input/output lines of the memory and may be used to further adjust a delay amount of a signal propagating through a command path of a memory. The delay adjust circuit 500 may add a single clock cycle, tCK, amount of delay to a signal based on the external system clock. The single clock cycle may be added when the loop counter N is odd due to the reduced amount of delay added by a shift circuit, such as the shift circuit 204 of FIG. 2.

The delay adjust circuit 500 may receive the DQEn as an input shown in FIG. 2. The DQEn in FIG. 5, may be provided as an input to a MUX 504 and a delay 502, which also provides an input to the MUX 504. The delay 502 may add a single clock cycle amount of delay to the DQEn signal, such as a +1*tCK amount of delay. The delay 502 also receives a clock input from a frequency doubler 510. The frequency doubler 510 receives a CLKOUTB as an input, which may have a rate of 2tCK during the gear down mode, and doubles this frequency back to the external system clock frequency. The delay 502 may use the doubled clock signal to add the tCK delay amount to the DQEn signal.

The MUX 504 may select which input to provide as an output based on the ODD_N control signal. As discussed above, the ODD_N control signal may be generated by control logic (not shown) and may indicate when the loop counter value N is odd. When N is even, the undelayed DQEn signal is provided as an output by the MUX 504 to an AND gate 516. When N is odd, however, the ODD_N control signal directs the MUX 504 to select the delayed DQEn signal to provide as an input to the AND gate 516.

In addition to the output of the MUX 504, the AND gate 516 also receives the output of the frequency doubler 510. The frequency doubled clock signal may be used to time and clock out data on the D flip flop 508. The D flip flop 501 may receive data on the D input and be clocked by the output of the AND gate 516. Thus, the AND gate 516 may assert high when both the output of the frequency doubler 510 and the MUX 504 are both high. Further, when N is odd, the output of the MUX 504 may be delayed an extra tCK clock cycle to ensure the Cas latency is met. When N is even, this extra delay may not be needed and is thus not added to the DQEn path.

Referring back to FIG. 2, the apparatus 200 may receive a reset signal in conjunction with or after receiving the gear down command. In either instance, the apparatus 200 may transition to the reduced clock rate and switch to using the CL' and N' and the apparatus 200 may reset the timing circuit 216. This scenario may have a different delay calculation for various stages of the apparatus 200 due to the new clock rate and a new loop counter value N. A new loop counter value N may be generated since, the timing circuit 216 may be reset after the reduced clock, rate is implemented.

The amount of delay associated with the combination of the adjustable delay circuit 202, the phase splitter 218 and the buffer 210 may change to N*2tCK-(DLL delay model), with 2tCK being used instead of tCK due to N being generated using the 2tCK clock signal. Additionally, the delay associated with the shift circuit 204 changes to that discussed above to (CL/2−N)*2tCK. Here, N is not divided by two and 2tCK is being, used due to this N being generated with the reduced clock rate. This same change may also impact any delay added by the signal distribution network 214. However, since the new N was calculated based on the reduced clock rate, whether N is even or odd may no longer be relevant. As such, no additional delay may be added by the signal distribution network 214. This scenario may be implemented using the embodiments discussed herein with only adjusting some of the control signals. For example, a control signal for the MUX 314 of FIG. 3 may be a zero so that the in phase output of the phase splitter 312 is selected. Similarly, for example, the control signals for the MUX 404 of FIG. 4 and the MUX 504 of FIG. 5 may also be zeros to select the unadjusted inputs of the respective MLA.

Figure 6:
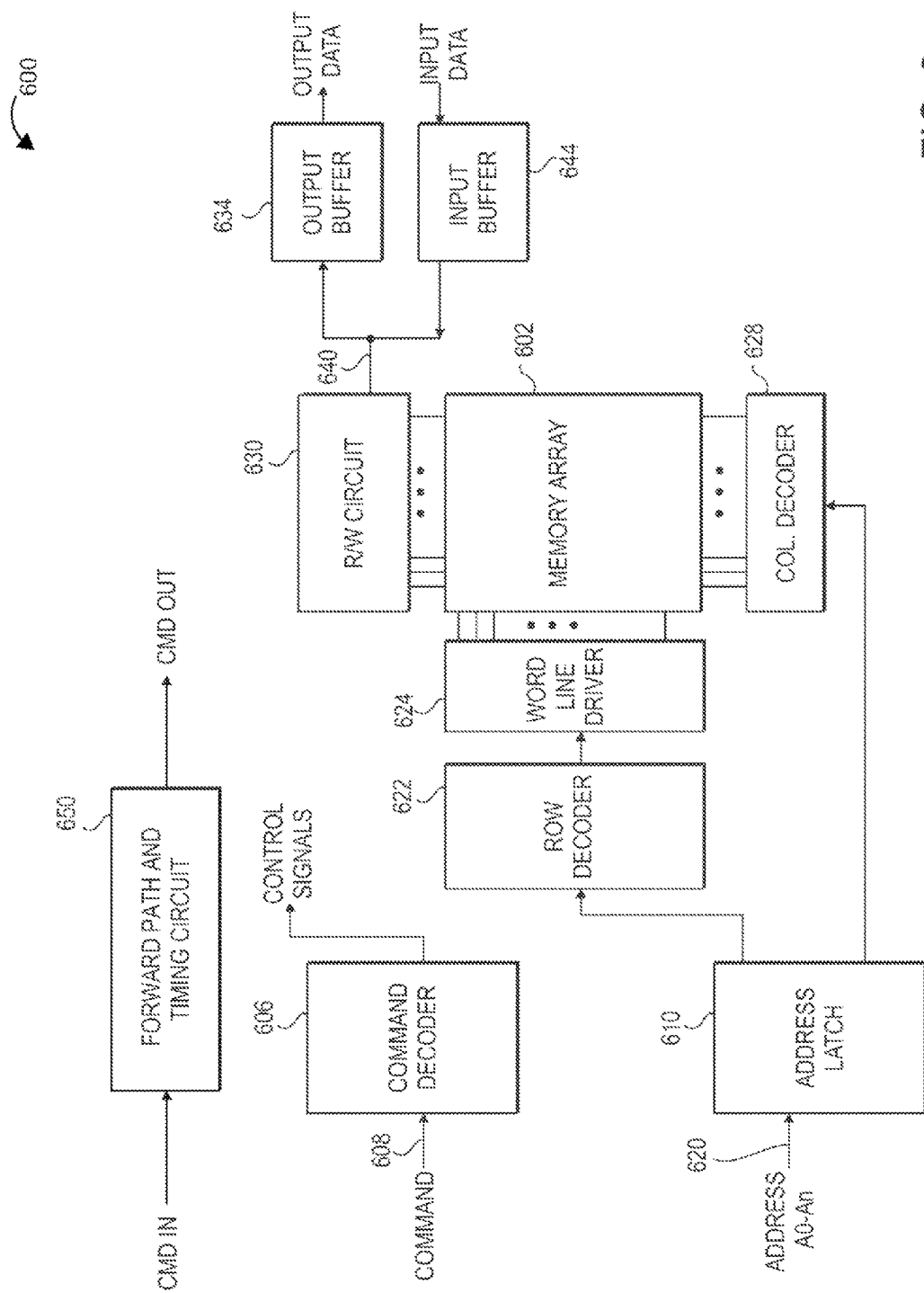
FIG. 6 is an illustrative block diagram of a memory arranged in accordance with embodiments discussed herein.

FIG. 6 illustrates a memory 600 including a timing domain transfer circuit arranged according to an embodiment as discussed herein. The memory 600 includes an array 602 of memory cells, which may be, for example, volatile memory cells (e.g., DRAM memory cells, SRAM Memory cells), non-volatile memory cells (e.g., flash memory cells), or some other types of memory cells. The memory system 600 includes a command decoder 606 that receives memory commands through a command bus 608 and generates corresponding control signals within the memory system 600 to carry out various memory operations. The command decoder 606 responds to memory commands applied to the command bus 608 to perform various operations on the memory array 602. For example, the command decoder 606 is used to generate internal control signals to read data from and write data to the memory array 602. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding, to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630.

A forward path and timing circuit 650 may be a part of the command decoder 606 and may be used to delay command signals with respect to a latency, such as a CAS latency, and may operate based on a clock signal provided by the timing circuit. Further, the forward path and timing, circuit 650 may be configured to transition to a gear down mode based on receiving a signal designating such operational mode. The gear down mode may cause the memory 600 to operate at a reduced clock rate, e.g., half the clock rate as before, to save power and to gain more margin in timing constraints.

By reducing the clock rate, however, the forward path and timing circuit 650 may need to adjust certain operating parameters so that operation of the memory 600 is uninterrupted. For example, a DLL of the forward path and timing circuit 650 may not remain in a locked condition upon transitioning to the reduced clock rate. Remaining in the locked condition may further depend on a value of a loop counter N, e.g., whether the value is even or odd. An even loop counter value may allow the DLL to remain locked upon transitioning to the lower clock rate. An odd loop counter value, however, may cause a feedback signal to be out of phase with a reference signal. Is this scenario, the DLL may invert the feedback signal to remain in the locked condition.

Additionally a shift circuit that compensates for latency demands for strobing input/output pads may also need to be adjusted due to the reduced clock rate. The value of the CAS latency (CL) may be divided by two. Further, the amount of delay added by the shift circuit may depend on the loop counter value as well. If the loop counter value is even, the value is divided by two. If the loop counter value is odd, the value is divided by two then rounded up to the next integer. These new values for CL and N−CL' and N'− may be combined, e.g. CL' minus N', to obtain the amount of delay the shift circuit is to add to the forward path circuit. Moreover, if N is odd, an additional clock cycle of delay may be added to the signal by the individual paths of the signal distribution network, e.g., the timing tree, which may be a part of the output buffer 634 for example. The additional clock cycle delay may be based on the non-reduced clock rate. By adjusting the delay of the forward path, the memory 600 may be ensuring the DQ pads are strobed at the expected time.

Memories in accordance with embodiments of the present invention may be used in any of a variety of electronic devices including, but not limited to computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a forward path circuit configured to delay a signal; and
a timing circuit configured to:
provide a clock signal to the forward path;
adjust a rate of the clock signal responsive to receipt of a command to adjust the rate of the clock signal;

select a first feedback clock signal responsive to a loop delay of the timing circuit comprising an even number of clock cycles;
select a second feedback clock signal responsive to the loop delay of the timing circuit comprising an odd number of clock cycles; and
provide a control signal to an adjustable delay circuit of the forward path circuit.

2. The apparatus of claim 1, wherein the timing circuit is configured to provide the first feedback clock signal that is in-phase with an input clock signal responsive to the loop delay comprising an even number of clock cycles.

3. The apparatus of claim 1, wherein the timing circuit is configured to provide the second feedback clock signal that is out of phase with an input clock signal responsive to the loop delay comprising an odd number of clock cycles.

4. The apparatus of claim 3, wherein the timing circuit comprises a phase splitter configured to provide the out of phase second feedback clock signal.

5. The apparatus of claim 1, wherein timing circuit comprises a phase detector configured to provide the loop delay.

6. The apparatus of claim 1, wherein the timing circuit comprises a delay locked loop.

7. An apparatus comprising:
a forward path circuit configured to delay a signal; and
a timing circuit configured to:
provide a clock signal to the forward path;
adjust a rate of the clock signal responsive to receipt of a command to adjust the rate of the clock signal;
select a feedback clock signal responsive to a loop delay of the timing circuit; and
provide a control signal to an adjustable delay circuit of the forward path circuit, wherein the timing circuit being configured to reduce a rate of the clock signal comprises the timing circuit being configured to reduce the rate of the clock signal by half.

8. An apparatus comprising:
a forward path circuit configured to delay a signal; and
a timing circuit configured to:
provide a clock signal to the forward path;
adjust a rate of the clock signal responsive to receipt of a command to adjust the rate of the clock signal;
select a feedback clock signal responsive to a loop delay of the timing circuit;
provide a control signal to an adjustable delay circuit of the forward path circuit; and
a latency control circuit coupled to a shift circuit and configured to provide an adjusted latency value responsive to receipt of the command.

9. An apparatus comprising:
a forward path configured to delay a signal based at least a on a loop delay and a latency value; and
a latency control circuit configured to provide an adjusted latency value as the latency value and an adjusted loop delay as the loop delay responsive to receipt of a command, wherein the forward path is configured to operate at least in part at an adjusted clock rate responsive to receipt of the command.

10. The apparatus of claim 9, further comprising a timing circuit configured to provide a clock signal to the forward path.

11. The apparatus of claim 10, wherein the timing circuit is further configured to reduce a rate of the clock signal responsive to receipt of the command.

12. The apparatus of claim 11, wherein the timing circuit is configured to provide the adjusted latency value and the adjusted loop delay to a shift circuit of the forward path.

13. The apparatus of claim 10, wherein the timing circuit is configured to adjust the delay of the forward path signal based on the adjusted clock rate of the forward path operation.

14. The apparatus of claim 9, wherein the adjusted loop delay comprises the loop delay divided by two if the loop delay is an even number of clock cycles.

15. The apparatus of claim 9, wherein the adjusted loop delay comprises the loop delay divided by two and rounded up to the next integer if the loop delay is an odd number of clock cycles.

16. The apparatus of claim 15, further comprising a signal distribution network coupled to the forward path, wherein the signal distribution network is configured to add an additional delay to a signal propagating through the network if the loop delay is an odd number of clock cycles.

17. A method comprising:
adjusting a clock rate of a timing circuit;
determining a feedback clock signal used by the timing circuit based on whether a loop delay of the timing circuit comprises an even number of clock cycles or an odd number of clock cycles; and
adjusting a delay of a shift circuit based at least in part on an adjusted loop delay.

18. The method of claim 17, further comprising:
adjusting the loop delay responsive to receipt of a command to adjust the clock rate to provide the adjusted loop delay.

19. A method comprising:
adjusting a clock rate of a timing circuit;
determining a feedback clock signal used by the timing circuit based on a loop delay of the timing circuit; and
adjusting a delay of a shift circuit based at least in part on an adjusted loop delay; and
adjusting the loop delay responsive to receipt of a command to adjust the clock rate to provide the adjusted loop delay, wherein adjusting the loop delay comprises dividing the loop delay by two and rounding up to a next integer if the loop delay comprises an odd number of dock cycles.

20. A method comprising;
adjusting a clock rate of a timing circuit;
determining a feedback clock signal used by the timing circuit based on a loop delay of the timing circuit; and
adjusting a delay of a shift circuit based at least in part on an adjusted loop delay, wherein determining a feedback clock signal used by the timing circuit based on a loop delay comprises:
selecting an in-phase clock signal for the feedback signal based on the loop delay comprising an even number of clock cycles, wherein the in-phase clock signal is in-phase with an input clock signal; and
selecting an out of phase clock signal for the feedback signal based on the loop delay comprising an odd number of clock cycles, wherein the out of phase clock signal is out of phase with the input clock signal.

21. A method comprising:
adjusting a clock rate of a timing circuit;
determining a feedback clock signal used by the timing circuit based on a loop delay of the timing circuit; and
adjusting a delay of a shift circuit based at least in part on adjusted loop delay, wherein adjusting a clock rate of a timing circuit comprises reducing the clock rate by half.

22. A method comprising:
adjusting a clock rate of a timing circuit;
determining a feedback clock signal used by the timing circuit based on a loop delay of the timing circuit;
adjusting a delay of a shift circuit based at least in part an adjusted loop delay and:
when the loop delay comprises an odd number of clock cycles, adding additional delay to a signal propagating through a signal distribution network.

* * * * *